(12) United States Patent
Huang et al.

(10) Patent No.: US 7,566,887 B2
(45) Date of Patent: Jul. 28, 2009

(54) METHOD OF REDUCING PARTICLE CONTAMINATION FOR ION IMPLANTERS

(75) Inventors: Yongzhang Huang, Hamilton, MA (US); Que Weiguo, Melrose, MA (US); Zhang Jincheng, Brighton, MA (US)

(73) Assignee: Axcelis Technologies Inc., Beverly, MA (US)

( * ) Notice: Subject to any disclaimer, the term of this patent is extended or adjusted under 35 U.S.C. 154(b) by 270 days.

(21) Appl. No.: 11/648,979

(22) Filed: Jan. 3, 2007

(65) Prior Publication Data

US 2008/0157681 A1 Jul. 3, 2008

(51) Int. Cl.
*G21K 5/00* (2006.01)
(52) U.S. Cl. .............................. 250/492.21; 250/396 R; 250/492.1; 250/492.2
(58) Field of Classification Search ............... 250/492.1, 250/492.2, 492.21, 492.3, 396 R, 397, 398, 250/423 R, 424, 492.23, 493.1, 503.1
See application file for complete search history.

(56) References Cited

U.S. PATENT DOCUMENTS

| | | | | |
|---|---|---|---|---|
| 4,172,008 | A * | 10/1979 | Fleet | 376/127 |
| 5,212,425 | A * | 5/1993 | Goebel et al. | 315/111.21 |
| 5,557,215 | A * | 9/1996 | Saeki et al. | 324/765 |
| 6,013,913 | A * | 1/2000 | Hanson | 250/287 |
| 6,452,196 | B1 * | 9/2002 | Vanderberg | 250/492.21 |
| 6,459,082 | B1 * | 10/2002 | Sakaguchi | 850/43 |
| 2002/0053642 | A1 | 5/2002 | Berrian | |
| 2006/0208187 | A1 * | 9/2006 | Mordehai et al. | 250/292 |
| 2006/0219954 | A1 | 10/2006 | Low et al. | |
| 2006/0226372 | A1 * | 10/2006 | Yanagisawa et al. | 250/396 R |
| 2006/0284116 | A1 * | 12/2006 | Berrian et al. | 250/492.21 |
| 2007/0152136 | A1 * | 7/2007 | Yao et al. | 250/214 A |
| 2007/0295911 | A1 * | 12/2007 | Sved | 250/359.1 |
| 2008/0067433 | A1 * | 3/2008 | Weiguo et al. | 250/492.21 |

OTHER PUBLICATIONS

U.S. Appl. No. 11/441,609, filed May 26, 2006, Weiguo et al., Entire Document.

* cited by examiner

*Primary Examiner*—Jack I Berman
*Assistant Examiner*—Nicole Ippolito Rausch
(74) *Attorney, Agent, or Firm*—Eschweiler & Associates, LLC

(57) ABSTRACT

The present invention is directed to a beam control circuit and method used to minimize particle contamination in an ion implantation system by reducing the duty factor of the ion beam. In one embodiment the beam control circuit comprises a high voltage switch connected in series with a power supply and an ion source portion of the ion implantation system, wherein the switch is operable to interrupt or reestablish a connection between the power supply and an electrode of the ion source including electrodes for plasma production. The beam control circuit also comprises a switch controller operable to control the duty factor of the ion beam by controlling the switch to close before a start of ion implantation and to open after a completion of implantation or at other times when the beam is not needed, thereby minimizing beam duty and particle contamination. The beam control technique may be applied to wafer doping implantation and duty factor reduction. Protection circuits for the high voltage switch absorb energy from reactive components and clamp any overvoltages.

38 Claims, 12 Drawing Sheets

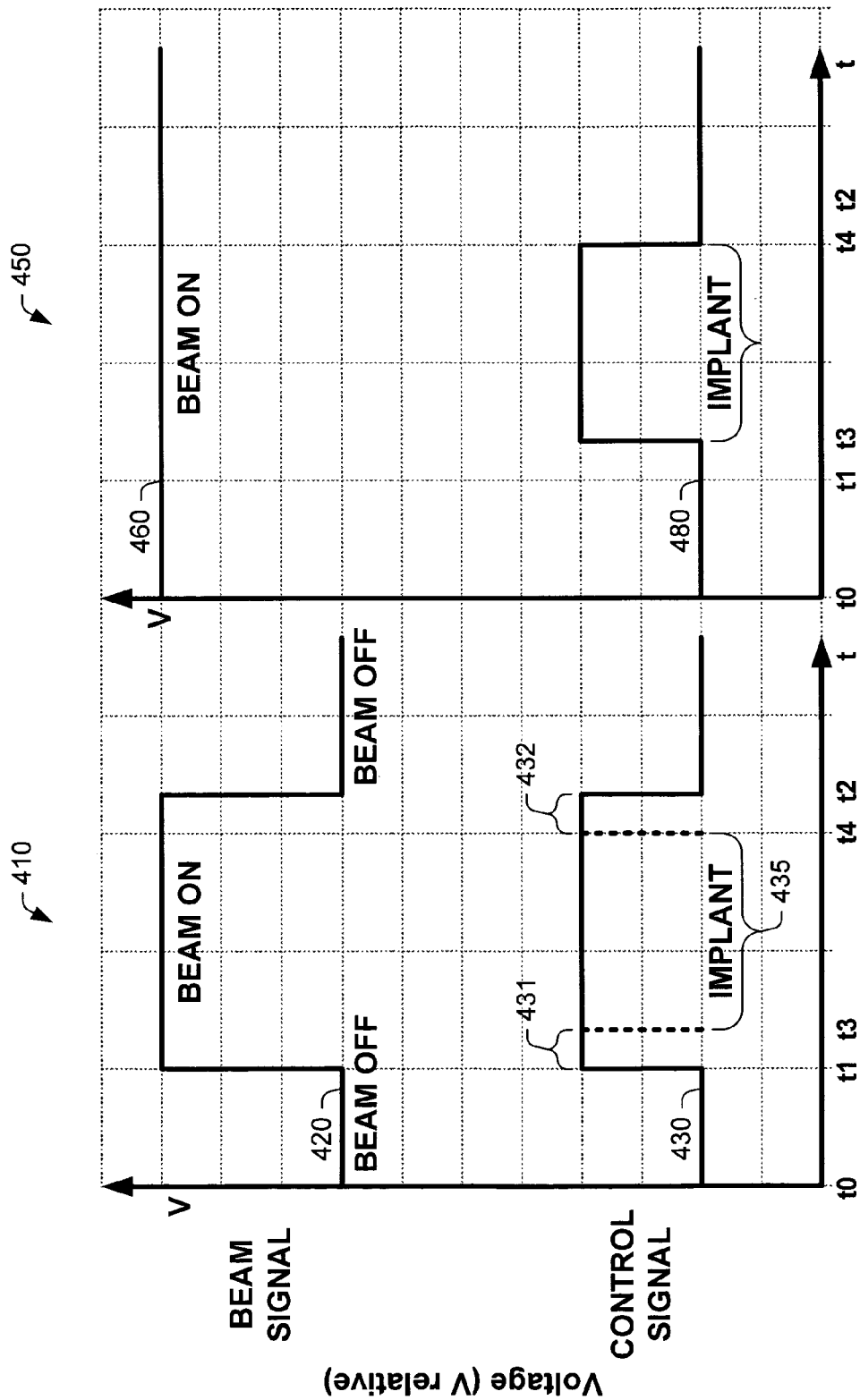

METHOD OF REDUCING PARTICLE CONTAMINATION FOR ION IMPLANTERS

FIELD OF THE INVENTION

The present invention relates generally to ion implantation systems, and more particularly to a beam control circuit used to minimize particle contamination in an ion implantation system, and to a method of reducing the duty factor of the ion beam from an ion source to minimize particle contamination using a high voltage switch between a power supply and an electrode associated with the ion source to initiate or terminate the ion beam during ion implantation operations.

BACKGROUND OF THE INVENTION

Ion implantation systems are used to impart impurities, known as dopant elements, into semiconductor substrates or wafers, commonly referred to as workpieces. In such systems, an ion source ionizes a desired dopant element, and the ionized impurity is extracted from the ion source as a beam of ions. The ion beam is directed (e.g., swept) across respective workpieces to implant ionized dopants within the workpieces. The dopant ions alter the composition of the workpieces causing them to possess desired electrical characteristics, such as may be useful for fashioning particular semiconductor devices, for example, transistors upon the substrates.

The continuing trend toward smaller electronic devices has presented an incentive to "pack" a greater number of smaller, more powerful and more energy efficient semiconductor devices onto individual wafers. This necessitates careful control over semiconductor fabrication processes, including ion implantation and more particularly to the avoidance of particle contamination during ion implantation of the wafers. The so-called particle contamination means particles (tiny piece of materials either from the beamline elements or from the wafer handling elements, in the range of sub-micrometers to micrometers) are implanted onto, or otherwise move onto the wafer surface and stay on the surface. Moreover, semiconductor devices are being fabricated upon larger workpieces to increase product yield. For example, wafers having a diameter of 300 mm or more are being utilized so that more devices can be produced on a single wafer. Such wafers are expensive and, thus, make it very desirable to mitigate waste, such as having to scrap an entire larger wafer due to the affects of particle contamination during ion implantation or blocking the wafer areas under the particles from being processed or implanted.

One of the key contributors of particles is beam strikes, for example, on the extraction electrodes, on the beam line wall, on the apertures along the beam line, and on the faraday cups. These particles are then carried along with the ion beam and reach the target parts or wafers as contaminates which may affect the quality, dose level uniformity, yield and reliability of the implanted parts.

Accordingly, there is a need for mitigating the effects of particle contamination due to beam strikes within an ion implanter to provide minimal particle contamination with uniform implantation over the whole wafer or work piece.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a circuit and method for reducing particle contamination that may be produced by beam strikes with electrodes and walls associated with the ion source and any other elements along the beamline of an ion implantation system. Also, more beam strikes make the wall surfaces more frangible which may cause additional particles to be generated by subsequent beam strikes. By reducing the beam duty or duration of such beam strikes, contaminate generation is also reduced. Several beam control or switch control circuits are disclosed that incorporate a high voltage high speed (HVHS) switch added in series between a high voltage supply and its respective electrode. For example, one or more of a suppression, extraction, cathode, or arc voltage supply and a respective electrode associated with the ion source may be switched by the HVHS switches to initiate or terminate the ion beam and reduce the beam ON-time or beam duty, thereby reducing the level of contaminates produced as a result of beam strikes.

The beam control circuit of the present invention comprises a high voltage switch connected in series with a power supply and an element associated with an ion source portion of the ion implantation system, wherein the switch is operable to interrupt or reestablish a connection between the power supply and the electrode. The beam control circuit also comprises a switch controller operable to control the duty factor or duty cycle of a beam produced within the ion implantation system by controlling the switch to close minimally before the start of ion implantation and to open minimally after completion of the implantation, thereby minimizing particle contamination. The beam control technique may be applied to wafer doping implantation and duty factor reduction.

The system of the present invention may also comprise one or more protection circuits which protect the high voltage switch and the associated power supplies by absorbing energy from reactive components and clamping any overvoltages that may occur across the switch and the power supply at the moment the switch opens or closes. The protection circuits comprise either series protection circuits wired in series with the high-voltage switch, or parallel protection circuits wired in parallel with the high-voltage switch, or both to protect the high voltage switches.

According to one or more aspects of the present invention, a beam control circuit for an ion source of an ion implantation system suitable for use in implanting ions into one or more workpieces is disclosed. In one aspect of the invention, the system includes one or more high voltage high speed (HS) switches connected in series with a power supply (e.g., a high voltage extraction, suppression supply, an arc voltage, a cathode voltage, or a filament voltage supply) for the ion source (or one of several such electrodes), the HVHS switches operable to conduct or interrupt the HV power supply connection to the ion source or electrodes to initiate or terminate the ion beam. The quantities of ions that can be extracted from the ion source are in the form of an ion beam having a beam current.

In another embodiment, the switch controller of the present invention is further operable to detect a current or voltage change associated with an arc in the ion source or HV electrodes and to control the one or more HVHS switches associated with the ion source or HV electrodes to open or close based on the current or voltage change detection in order to quench the arc. When a current or voltage change associated with the arc is detected, the switch will be set to open until the arc is extinguished, and then set to close thereafter. In addition, the switch may be repeatedly opened and closed for a number of glitches.

In another aspect of the invention the system further comprises a synchronization circuit operable to synchronize and time the switch controllers of two or more beam control circuit for the opening and closing of two or more high voltage switches of the ion implantation system.

In still another aspect, the current or voltage change detection associated with the ion source comprises detecting one of a current surge in the HV power supply, a decrease in an ion beam current, a drop in a suppression electrode voltage, and a drop in an extraction electrode voltage associated with an arc in order to quench the arc.

In yet another aspect, one of the protection circuits is connected in series with the HV switch it protects.

In one aspect, one of the protection circuits is connected in parallel with the HV switch it protects.

In another aspect of the present invention the system further comprises an extraction suppression electrode located close to the ion source.

In still another aspect, the power supply and the electrode associated with the ion source portion of the ion implantation system comprises one or more of an arc voltage and a cathode voltage power supply and electrode associated with the ion implanter.

In yet another aspect, the power supply and the electrode associated with the source portion of the ion implantation system comprises one or more of an arc voltage power supply and electrode associated with the implanter.

In another aspect, the duty cycle of the beam comprises a desired on-time to off-time ratio wherein the desired on-time generally corresponds to the ion implantation time and the desired off-time generally corresponds to an idle time of the beam after ion implantation.

In one embodiment of the present invention the switch controller is further operable to control the high-voltage switch to close for a first time interval before the start of ion implantation and to remain closed for a second time interval after a conclusion of ion implantation. The first and second time intervals may be about 1 ms or less, or in another embodiment may be from about 1 ms to about two minutes depending on the actions that may need to be done during the intervals.

In one aspect the switch controller is operable to quench an arc associated with the ion source or the high voltage electrodes, utilizing the high voltage switch and the associated voltage supply.

In another aspect of the present inventions, the switch controller is further operable to terminate the ion beam during one of the following: arrival at a wafer load or unload position, a manual beam off switch operation, an arc detection, and a wafer exchange. In addition, the switch controller is also operable to initiate the ion beam during one of the following: a manual beam on-switch operation, subsequent to a wafer exchange, following a load operation, and upon a command to implant another wafer.

In yet another aspect of the present invention, the switch controller is further operable to receive a beam duty factor command from the ion implantation system or a motion control system to disable the high-voltage switch during one of the following: arrival at a wafer exchange position, receipt of a manual beam off switch command, waiting for a next wafer or an implant auto recovery, and prior to a wafer exchange.

In accordance with one or more other aspects of the present invention, a beam control circuit for minimizing particle contamination in an ion implantation system is also disclosed comprising an ion source for producing a quantity of ions which can be extracted in the form of an ion beam, and a high-voltage switch connected in series with a power supply and electrode associated with the ion source portion of the ion implantation system, operable to interrupt or reestablish a connection between the power supply and the electrode. The system further comprises a switch controller operable to initiate the ion beam before ion implantation by closing the high-voltage switch, and to terminate the ion beam after ion implantation by opening the high-voltage switch, thereby minimizing particle contamination.

In accordance with another aspect of the present invention, a method of reducing the duty factor of an ion beam to minimize particle contamination in an ion implantation system utilizing a switch controller and a high-voltage switch connected between a supply and an electrode associated with an ion source of the ion implantation system comprising, receiving one of an ion beam on command or off command, initiating the ion beam before a start of ion implantation by closing the high-voltage switch in response to the ion beam on command and implanting ions. The method further comprises terminating the ion beam after a conclusion of ion implantation by opening the high-voltage switch in response to the ion beam off command, thereby minimizing the ion beam duty factor and particle contamination.

In another aspect of the invention the method comprises synchronizing two or more switch controllers having two or more high-voltage switches used to initiate or terminate the ion beam associated with the electrodes of two or more respective voltage supplies for the ion implanter. For example, this may comprise synchronizing the switches of the extraction power supply and one or more suppression power supplies.

In yet another aspect of the invention the switch controller of the method is operable to control the high-voltage switch to close for a first time interval before the start of ion implantation and to remain closed for a second time interval after the conclusion of ion implantation.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 4A is a plot of the beam signal and control signal voltages for control of the ion beam of an ion implanter as may be used in accordance with the present invention of FIG. 1;

FIG. 4B is a plot of the beam signal and the implant time interval in a prior art;

DETAILED DESCRIPTION OF THE INVENTION

Figure 1:
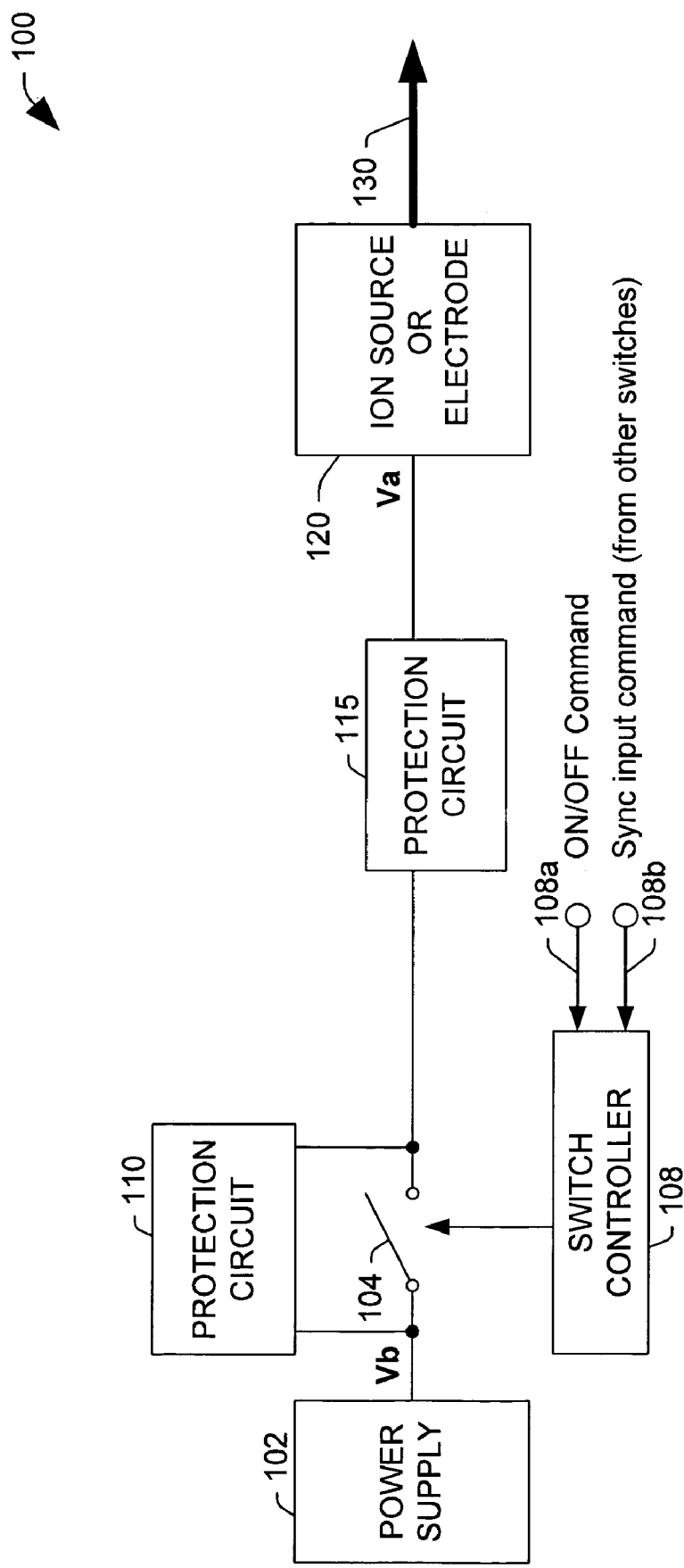
FIG. 1 is a schematic block diagram illustrating components of a beam control circuit 100 of an ion implantation system according to one or more aspects of the present invention used to initiate or terminate the ion beam associated with an ion source of the ion implantation system.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

The present invention relates to ion beam control circuits and methods to minimize particle contamination in an ion implantation system, for example, due to beam strike within the implanter. The present invention seeks to reduce this particle contamination by reducing the beam duty factor or on-time of the beam, by turning off, for example, either the ion extraction or the plasma inside the arc chamber. For example, in order to turn off the ion extraction, one can turn off the extraction voltage and the suppression voltage. In order to turn off the plasma inside the arc chamber, one can, for example, turn off either the arc voltage or the cathode voltage, or some other parameter. A beam control circuit is discussed that shortens the on-time duration of the ion beam (duty factor), thereby reducing the production of beam strike derived contaminate particles that may produce non-uniformity or contamination of ion implantations, for example, in wafers or other such targets.

In accordance with the present invention, the beam control circuit utilizes high voltage high speed (HVHS) switches (e.g., 65 KV@2 MHz MOSFET switches) that are added in series with the voltage supplies to the suppression or extraction electrodes; and can use other low voltage high speed switches for arc, or cathode power suppliers, for example, to control the ion beam from the ion source plasma, or to control the plasma itself within the ion source. Before a start of ion implantation, the ion beam is initiated and stabilized. Shortly thereafter, the ions are implanted within the target (e.g., wafer). Shortly after implantation, the ion beam is then terminated to minimize the length of time that the ion beam is on (duty factor), and may be striking a wall along the beamline, an extraction electrode, a faraday cup or an aperture, for example, and producing contaminate particles and degrading the materials of the above mentioned elements.

Advantageously, these HVHS switches also provide the ion implanter with the ability to simply turn the ion beam ON or OFF at will, either manually with a switch or via command from one of the implanters control systems, its computer, or by an external input. As ion implanters may take a considerable time to sequence through a power up and warm up to a stable ion beam level that is useful for implantation, it is a tremendous advantage, after such a warm-up, to be able to turn the beam ON/OFF, for example, when loading or unloading a new wafer, at the start/end of each wafer scan, during implant auto recovery occurrences such as during beam or wafer movement difficulties, and if desired, even in portions of the over-travel regions of each row scan of a wafer. Thus, the system of the present invention facilitates this beneficial feature, known as "beam duty factor", which is the ratio of ON time of the ion beam to the whole time interval. The beam duty factor may thus be represented as:

Beam duty factor=Beam ON time/(beam ON time+ beam OFF time)

By having this ability to reduce this beam duty factor, the inventors of the present system anticipate reducing the particle count on a wafer, because the beam will be used to a greater percentage usefully on the wafer and less on peripheral surfaces adjacent to or before the wafer, for example.

In addition, when high voltage arcs occur between or to electrodes, the high voltage capacitors of such HV power supplies may be substantially discharged. This deep discharge dramatically affects the ion beam current and requires considerable time thereafter for the power supply voltages and the ion beam current (Ibeam) to recover. Such high voltage high speed switches have recently become available as a manufactured item, and thus find immediate use in such applications incorporating the arc quenching circuit(s) such as may be used in association with the beam control circuit of the present invention.

The high voltage switches are controlled by the switch controller based on the timing of the implantation system to reduce the beam duty factor, by adjusting or reducing the ion beam ON-time to substantially approximate the duration of the ion implantation. This beam duty factor will essentially comprise the total on-time of the beam relative to the actual implantation time, which is then based on a first time interval that the ion beam is ON before the start of ion implantation and a second time interval that the ion beam is ON after the conclusion of ion implantation. The first time interval allows time for the ion beam to stabilize before ion implantation.

Based on the particular electrode which is switched by the HVHS switch, the switching circuit may also comprise one or more protection circuits for the HV switch to absorb excess energy from reactive components surrounding the HVHS switches and to clamp any overvoltages (fly-back voltages) produced by the switching action. The protection circuits may be connected in parallel with and/or in series with a respective HVHS switch. The beam control circuits of the present invention may further comprise a synchronization circuit to sequence and synchronize the termination or reestablishment of the current and voltage to each of the electrodes and voltage supply circuits associated with an ion implantation system. For example, the switches for the extraction and suppression power supplies are usually synchronized together.

Although the HVHS switching circuit of the present invention is illustrated and described in the context of ion sources and ion implanters, those skilled in the art may appreciate that such high voltage high speed ion beam control circuits may also be utilized in other applications requiring HV and high speed beam control, such as x-ray equipment, accelerators, and other ion source applications, for example. In this manner, the duty factor of ion beams may be reduced to mitigate particle contaminates in the beam (e.g., the ion beam of an ion implanter).

Referring initially to FIG. 1, an exemplary beam control circuit 100 for a power supply of an ion source suitable for implementing one or more aspects of the present invention is depicted in block diagram form. The circuit 100 includes a power supply 102, a high voltage high speed HVHS switch 104, a switch controller 108 for opening and closing the HVHS switch 104 connected between the supply 102 and an electrode of an ion source 120 used for producing a quantity of ions that can be extracted in the form of an ion beam 130.

The HVHS switch 104 may also be protected by series and/or parallel protection circuits 110 and 115, respectively, to absorb energy from reactive components surrounding the switch 104 and to protect the switch from over-voltage damage. The protection circuits 110 and 115 also protect the switch 104 and other components of the ion implanter, by dampening any ringing or other such overvoltages induced by switching transients and the reactive components external to the HVHS switch 104. The beam control circuit 100 may be used in any ion implanter, or other applications such as may require beam control, or for example, which use a high voltage supply subject to arc discharges at the electrodes or at the output of the supply.

For example, beam control circuit 100 operates by receiving an external On or Off command 108A, or by receiving a sync input command 108*b* from other such switch controllers (switch circuits) into the switch controller 108. The switch controller 108 then closes high voltage switch HVHS 104 prior to the start of ion implant to connect Vb of power supply 102 to Va of an electrode or another such element of an ion source 120 which produces ion beam 130. Then after the conclusion of ion implant, the switch controller 108 opens high-voltage switch 104 again. When HVHS switch 104 opens, any overvoltages produced by the reactive components of the circuit 100, are absorbed by protection circuits 110 and 115, and Va drops to near zero and terminates the ion beam 130. In this way the beam control circuit 100 of the present invention reduces the beam duty factor or on-time of the beam 130, by cutting off the connection, for example, between the power supply 102 and the extraction, or the suppression, or the arc voltage, or the cathode voltage associated with an ion source 120 of an ion implantation system 100.

Alternately, the switch controller 108 and high-voltage switch 104 may be used to quench an arc occurring within the high-voltage circuits for an ion source 120, for example, by detecting a current or voltage associated with the arc, and may remain open until the arc no longer occurs. In addition, the switch may be repeatedly opened and closed until the arc no longer reoccurs.

Figure 2:
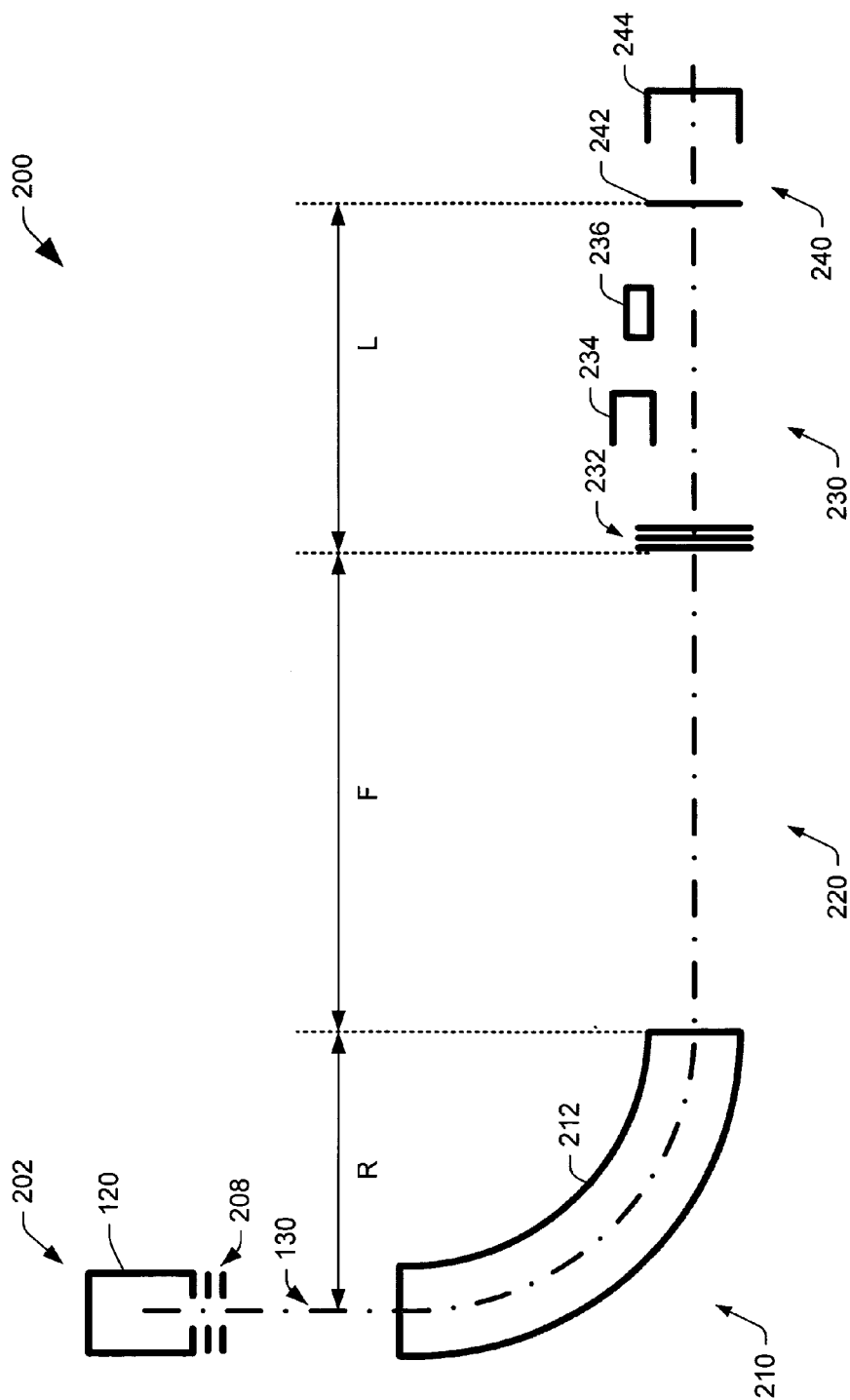
FIG. 2 is a simplified block diagram of an exemplary ion implantation system such as may utilize the beam control circuit of FIG. 1 of the present invention.

FIG. 2 illustrates an exemplary ion implantation system 200 such as may utilize a beam control circuit similar to that of 100 of FIG. 1, of the present invention. For example, ion implantation system 200 comprises an ion source 120 having several extraction/suppression electrodes 208, for providing a source of ions as an ion beam 130 for implantation system 200. The ions within ion beam 130 are initially analyzed in a first region 210 by a mass analyzing magnet 212 by way of magnetic deflection to filter ions of unwanted mass or energy. The mass analyzing magnet 212 operates to provide a field across the beam path 130 so as to deflect ions from the ion beam 130 at varying trajectories according to mass (e.g., charge to mass ratio). Ions traveling through the magnetic field experience a force that directs individual ions of a desired mass along the beam path 130 and deflects ions of undesired mass away from the beam path.

Those ions of ion beam 130 having the desired mass and energy are then accelerated or decelerated in a second region 220, and in region 230 focused by resolving aperture and deceleration plates 232, measured by setup faraday cup 234, and the beam is conditioned by a plasma shower 236 providing for space charge neutralization. Finally, the ion beam 130 enters an end station 240 for implantation in a wafer 242 the dose level of which is measured by a disk faraday cup 244.

Before and after ion implantation, the power supply to the extraction, suppression, arc voltage, or cathode electrodes, for example, associated with the ion source may be switched using a HVHS switch of a beam control circuit similar to that of FIG. 1 to minimize ion beam ON-time and beam strike, thereby mitigating particle contamination in an ion implantation system such as implantation system 200 of FIG. 2.

Figure 3A:
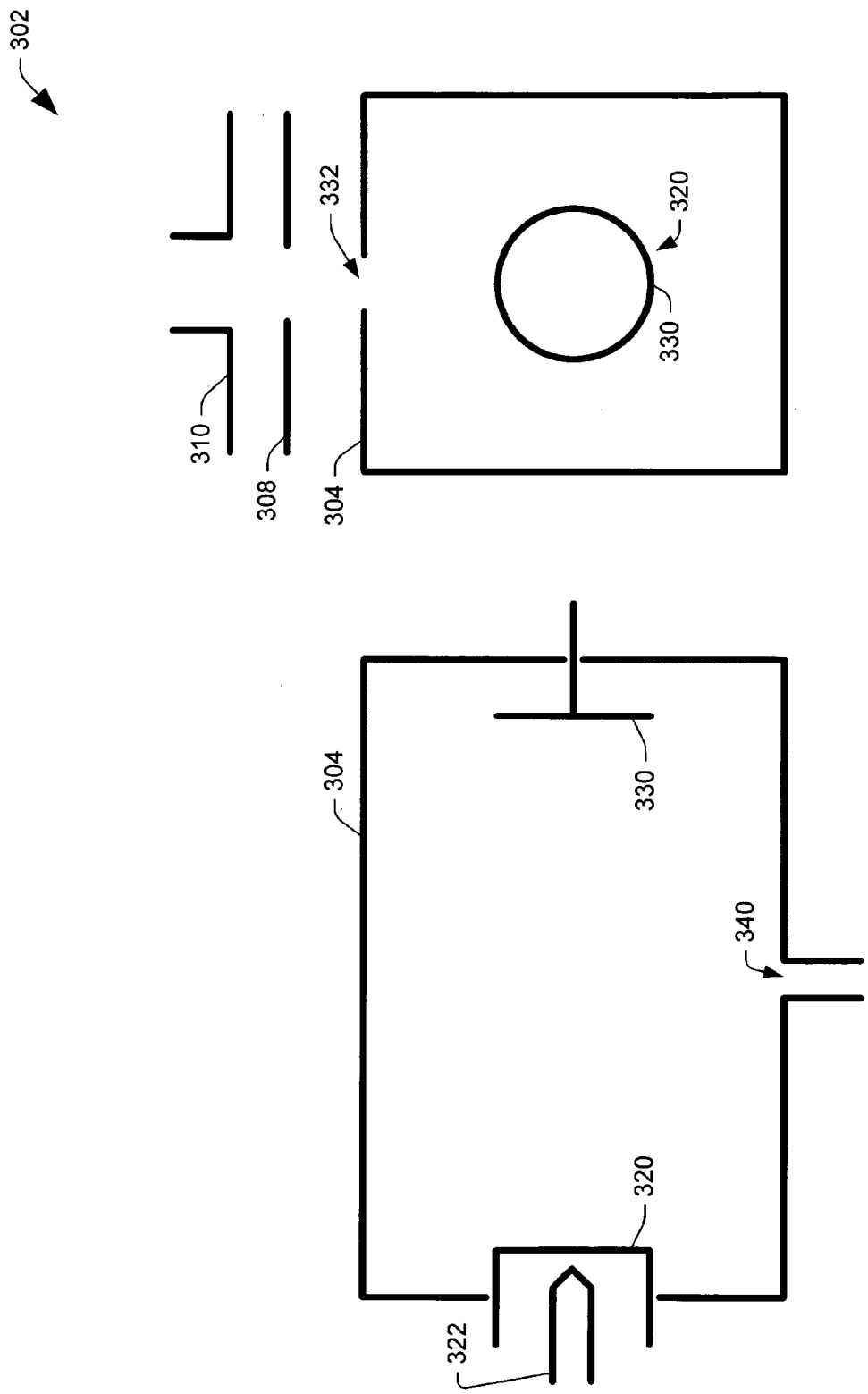
FIG. 3A is a simplified diagram of an exemplary ion source such as may be controlled by the beam control circuit of FIG. 1 of the present invention.
Figure 3B:
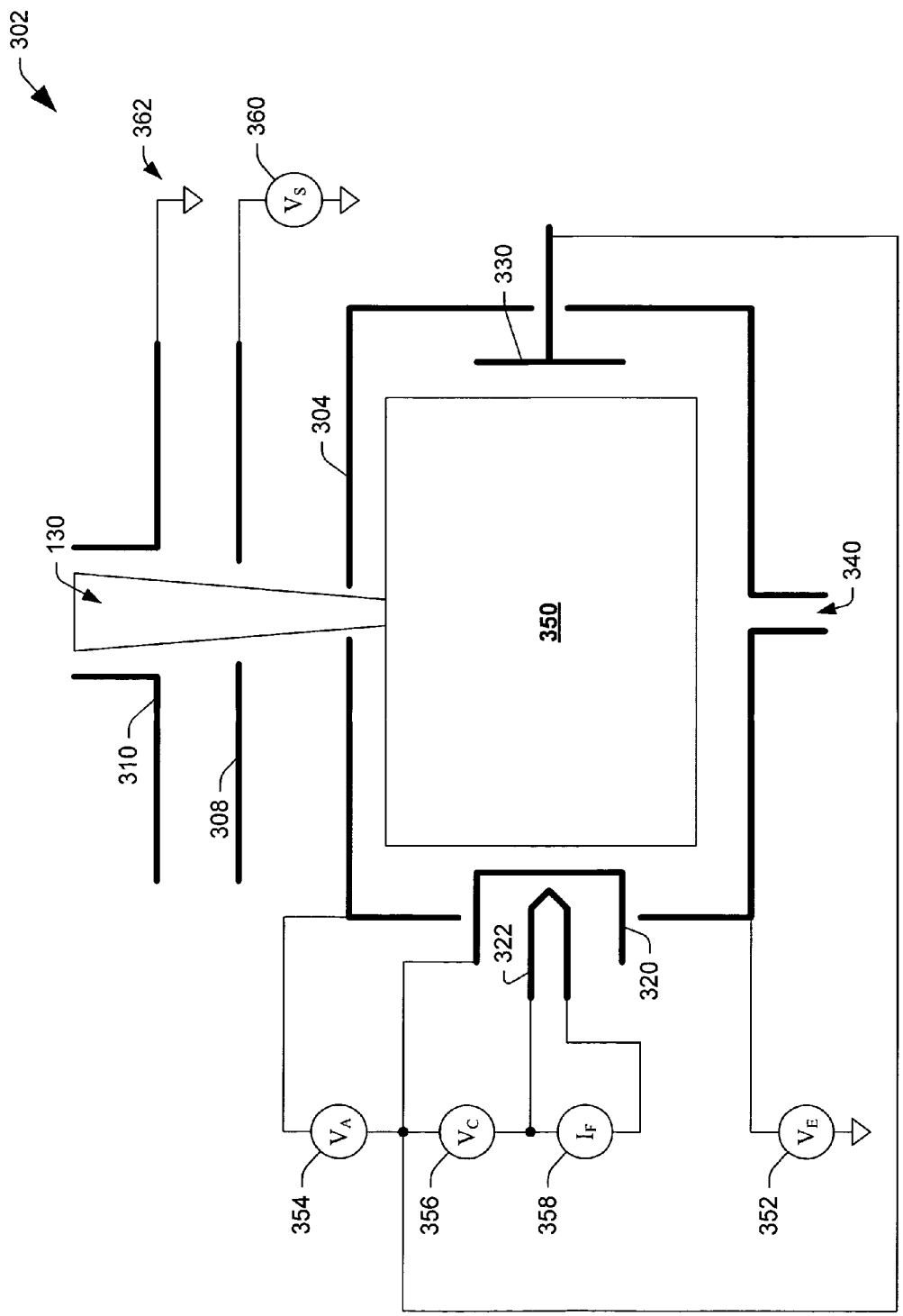
FIG. 3B is a simplified schematic diagram of the electrical connections of an exemplary ion source such as may be controlled by the beam control circuit of FIG. 1 of the present invention.

FIGS. 3A and 3B illustrate an exemplary ion source 302 such as may be controlled by the beam control circuit 108 of FIG. 1 in accordance with several aspects of the present invention. FIG. 3B further illustrates a schematic diagram of the electrical connections of the exemplary ion source 302 of the present invention.

Ion source 302 comprises an arc chamber 304 suppression electrodes 308 and ground electrodes 310. Arc chamber 304 comprises a cathode 320 heated by filament 322, and a repeller 330 used to contain a plasma 350 produced within the arc chamber 304. A gas of the desired molecular weight is injected into arc chamber 304 through a gas inlet 340. The gas is ionized by the electrons emitted from the cathode 320 and contained by repeller 330 to provide the plasma 350 contained within the arc chamber 304. The plasma is also contained by an external magnetic field which is not shown in the figure. The ions inside the plasma 350 are extracted between arc slits 332, to suppression electrodes 308 and to ground electrodes 310 to form an ion beam 130.

FIG. 3B further illustrates that an extraction voltage VE 352 is applied to the arc chamber 304 and that an arc voltage VA 354 is applied between the arc chamber 304 and the cathode 320. The ion source 302 also comprises a cathode voltage VO 356 applied between the cathode 320 and the filament 322, while the filament 322 receives a filament current IF 358 to heat the cathode 320. Ion source 302 further illustrates a typical triode extraction electrode system. The arc slit 332 forms one electrode which may be called an extraction electrode, a suppression electrode and a ground electrode. Arc slit 332 has a potential Ve. A suppression voltage VS 360 is applied to suppression electrodes 308 and a ground potential 362 is applied to ground electrodes 310. Cathode voltage VO 356 is applied to both cathode 320 and repeller 330 so as to confine the plasma 350 between the cathode 320 and repeller 330.

FIG. 4A illustrates a plot 410 of a beam signal 420 and a control signal 430 used for control of the ion beam (e.g., ion beam 130 of FIG. 1) using a beam control circuit (e.g., beam control circuit 100 of FIG. 1) of an ion implanter (e.g., ion implanter 200 of FIG. 2) such as may be used in accordance with the present invention.

FIG. 4B is a plot 450 of a beam signal 460 and a control signal 480 for an ion beam of an ion implanter in a prior art.

Comparing FIG. 4A of the present invention to FIG. 4B of a prior art, it can be observed that in the prior art the beam signal 460 is typically ON continuously, while the beam signal 420 of the present invention of FIG. 4A is only ON between time t1 and time t2, which may provide a brief interval before and after implantation. For example, a first interval 431 is provided between times t1 and t3, and a second time interval 432 is provided between times t4 and t2 after implantation 435. Implantation occurs between time t3 and time t4 of control signal 430 and implant control signal 480 of the prior art of FIG. 4B.

The first time interval 431, for example, allows adequate time for the ion beam 130 to stabilize before the start of ion implantation 435. For example, if the extraction (e.g., $V_E$ 352 of FIG. 3B) voltage and the suppression (e.g., $V_S$ 360 of FIG. 3B) voltage is switched, about 1 ms may provide adequate time, however, if the arc voltage (e.g., $V_A$ 354 of FIG. 3B) or the cathode voltage (e.g., $V_C$ 356 of FIG. 3B) is switched, a few seconds or more may be needed for the plasma (e.g., 350 of FIG. 3B) and ion beam (e.g., 130 of FIG. 3B) to stabilize.

Generally, the second time interval 432 between time t4 and time t2 may be relatively short, for example, about 1 ms or less whether the extraction, suppression, arc, or cathode voltage is switched off by the HVHS switch (e.g., 104 of FIG. 1), as the plasma (e.g., 350 of FIG. 3B) or the ion beam (e.g., 130 of FIG. 3B) disappear nearly instantaneously.

Also, the above mentioned first or second interval may be used to perform other actions desired for the implanter controls, those actions may be, for example, the beam diagnostics before or after the implantation. Those actions may add time to the first or second intervals.

Thus, the duty factor or ON-time of the beam signal 420 of FIG. 4A is dramatically reduced over the ON-time of the beam signal 460 of FIG. 4B of the prior art, thereby reducing the effects of particle contamination within the ion implantation system. Accordingly, the duty cycle of the beam is defined as the ratio of on-time/(on-time+off-time), wherein the on-time generally corresponds to the ion implantation time 435, and the off-time generally corresponds to the wafer swap time after the implant time 435. Sometimes, the off-time includes the idle time the system may require, for example, waiting for the next wafer, or during trouble in the other sub-systems of the ion implanter.

Figure 5A:
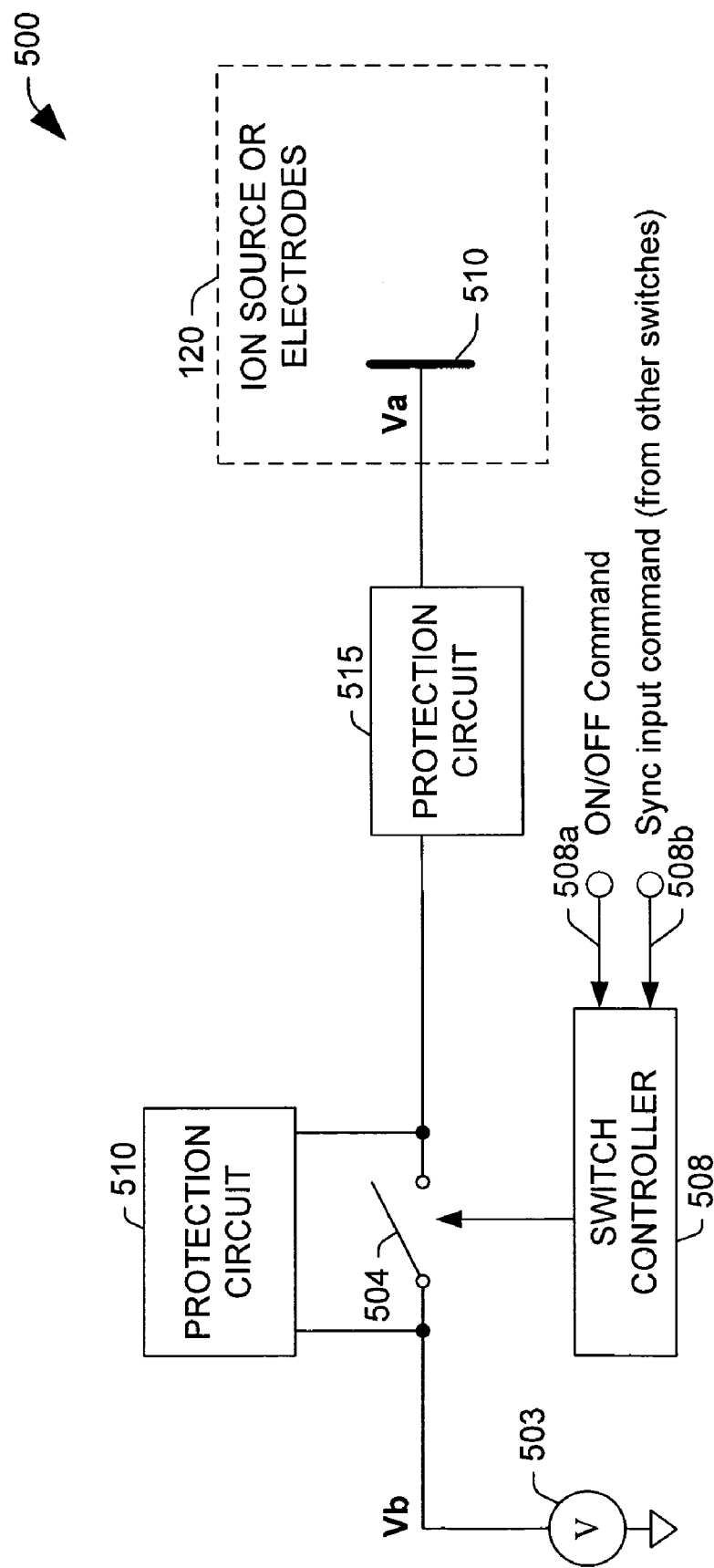
FIG. 5A is a schematic block diagram illustrating one embodiment of a beam control circuit 500 of an ion implantation system according to one or more aspects of the present invention used to initiate or terminate the ion beam by switching the extraction and/or suppression voltages to the respective electrodes associated with an ion source of the ion implantation system.
Figure 5B:
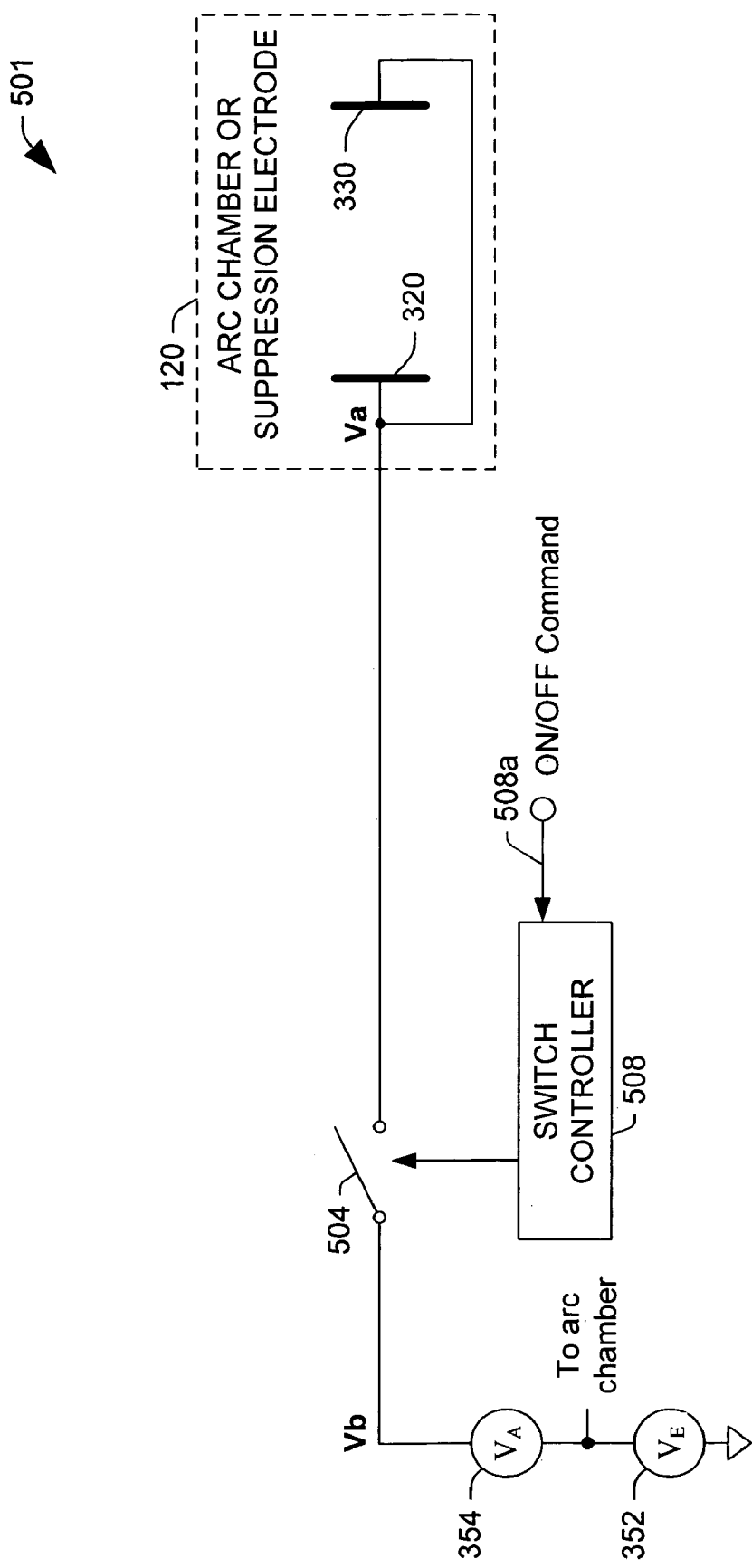
FIG. 5B is a schematic block diagram illustrating another embodiment of a beam control circuit 501 of an ion implantation system according to one or more aspects of the present invention used to initiate or terminate the plasma in the arc chamber by switching the arc voltage between the cathode/repeller and the arc chamber associated with an ion source of the ion implantation system.
Figure 5C:
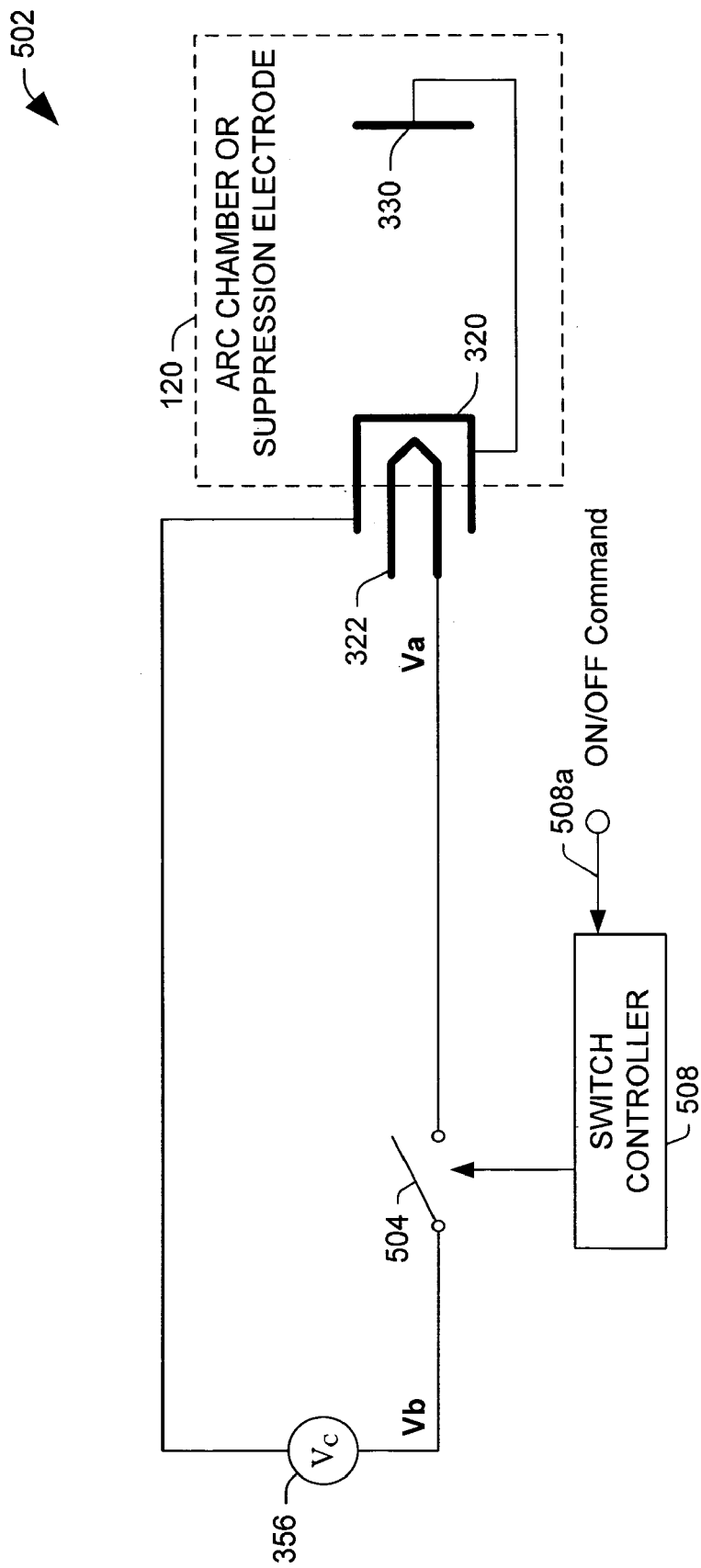
FIG. 5C is a schematic block diagram illustrating another embodiment of a beam control circuit 502 of an ion implantation system according to one or more aspects of the present invention used to initiate or terminate the plasma in the arc chamber by switching the cathode voltage between the filament and the cathode/repeller associated with an ion source of the ion implantation system.

FIGS. 5A, 5B, and 5C illustrate three exemplary beam control circuit schemes of an ion implantation system according to one or more aspects of the present invention used to initiate or terminate the ion beam by switching one or more of several various voltages to the respective electrodes associated with an ion source of the ion implantation system. Usually, an ion implanter only needs one of the above three schemes.

For example, FIG. 5A illustrates a beam control circuit 500 of an ion implantation system of the present invention used to initiate or terminate the ion beam by switching the extraction and/or suppression voltages to the extraction and/or suppression electrodes associated with an ion source of the ion implantation system. Beam control circuit 500 comprises an extraction or suppression voltage supply V 503 such as extraction voltage $V_E$ 352, or suppression voltage $V_S$ 360, respectively. Similar to beam control circuit 100 of FIG. 1, beam control circuit 500 of FIG. 5A further comprises a high voltage high speed HVHS switch 504, a switch controller 508 for opening and closing the HVHS switch 504 connected between the supply 503 and an electrode 510 of an ion source 120 used for producing a quantity of ions that can be extracted in the form of an ion beam such as ion beam 130.

Beam control circuit 500 further comprises one or more parallel and/or series protection circuits 510 and 515, respectively, to absorb energy from reactive components surrounding the switch 504 and to protect the switch from over-voltage damage. The protection circuits 510 and 515 also protect the switch 504 and other components of the ion implanter, by dampening any ringing or other such overvoltages induced by switching transients and the reactive components external to the HVHS switch 504. The beam control circuit 500 may be used in any ion implanter, or other applications such as may require beam control, or for example, circuits which use a high voltage supply subject to arc discharges at the electrodes or at the output of the supply.

Beam control circuit 500 operates by receiving an external On or Off command 508A, or by receiving a sync input command 508b from other such switch controllers (switch circuits) into the switch controller 508. The switch controller 508 then closes high voltage switch HVHS 504 prior to the start of ion implant to connect Va of the electrode 320 of ion source 120 to Vb of power supply 503 for production of an ion beam (e.g., 130 of FIG. 1). Then after the conclusion of ion implant, the switch controller 508 opens high-voltage switch 504 again. When HVHS switch 504 opens, any overvoltages produced by the reactive components of the circuit 500, are absorbed by protection circuits 510 and 515, and Va at the electrode 320 drops to near zero and terminates the ion beam. In this way the beam control circuit 500 of the present invention reduces the beam duty factor or on-time of the ion beam (e.g., 130 of FIG. 1) of the ion implantation system 500.

Typically, for example, an ion implant may have two of the above switches, one for the extraction power supply and the other for the suppression power supply. Typically, the above two switches are synchronized by the switch controller 508, for example.

FIG. 5B illustrates a beam control circuit 501 of an ion implantation system of the present invention used to initiate or terminate the plasma by switching the arc voltage $V_A$ 354, to the cathode 320 and repeller 330 associated with an ion source of the ion implantation system 501.

Beam control circuit 501 comprises an arc voltage $V_A$ 354. Similar to beam control circuit 100 of FIG. 1, beam control circuit 501 of FIG. 5B further comprises a high speed switch 504, a switch controller 508 for opening and closing the switch 504 connected between the arc voltage supply $V_A$ 354 and a cathode 320 and a repeller 330 of an ion source 120 used for producing a quantity of ions that can be extracted in the form of an ion beam such as ion beam 130.

Because beam control circuit 501 switches a much lower arc voltage supply $V_A$ 354 (e.g., about 100 volts) the parallel and/or series protection circuits 510 and 515 of FIG. 5A, for example, are usually unnecessary to protect the switch from over-voltage damage. The beam control circuit 501 may be used in any ion implanter, or other applications such as may require plasma control of the ion beam.

Beam control circuit 501 operates by receiving an external On or Off command 508A into the switch controller 508. The switch controller 508 then closes the switch 504 prior to the start of ion implant to let the voltage Va at the cathode 320 and repeller 330 become equal to the voltage Vb from power supply 354 for control of the plasma of an ion source (e.g., 120 of FIG. 1). Then after the conclusion of ion implant, the switch controller 508 opens high-voltage switch 504 again. When switch 504 opens the voltage Va at cathode 320 and repeller 330 drops to near zero and terminates the production of the plasma and disables the ion beam. In this way the beam control circuit 501 of the present invention reduces the beam duty factor or on-time of the ion beam (e.g., 130 of FIG. 1) of the ion implantation system 501.

FIG. 5C illustrates a beam control circuit 502 of an ion implantation system of the present invention used to initiate or terminate the plasma by switching the cathode voltage $V_C$ 356 to the cathode electrode 320 and repeller electrode 330 associated with an ion source 120 of the ion implantation system 502.

Beam control circuit 502 comprises a cathode voltage $V_C$ 356 connected to the cathode 320 and a high speed switch 504 which is connected to the filament 322. The beam control circuit 502 further comprises a switch controller 508 for opening and closing the switch 504 connected between the cathode voltage supply $V_C$ 356 and the filament 322 of an ion source 120 used for producing a quantity of ions that can be extracted in the form of an ion beam such as ion beam 130.

Because beam control circuit 502 switches a much lower cathode voltage $V_C$ 356 (e.g., about 600 volts) the parallel and/or series protection circuits 510 and 515 of FIG. 5A, for example, may be unnecessary to protect the switch from over-voltage damage. The beam control circuit 502 may be used in any ion implanter, or other applications such as may require plasma control of the ion beam.

As before, beam control circuit 502 operates by receiving an external On or Off command 508A into the switch controller 508. The switch controller 508 then closes switch 504 prior to the start of ion implant to let the voltage Va of the filament become equal to the voltage Vb from power supply $V_C$ 356, for control of the plasma of an ion source (e.g., 120 of FIG. 1). Then after the conclusion of ion implant, the switch controller 508 opens high-voltage switch 504 again. When switch 504 opens the voltage Va drops to near zero and terminates the production of the plasma which disables the ion beam. In this way the beam control circuit 502 of the present invention reduces the beam duty factor or on-time of the ion beam (e.g., 130 of FIG. 1) of the ion implantation system 502.

The scheme of FIG. 5A has the fastest time to start and stabilize the ion beam, and can be as fast as about 1 ms. The scheme of FIG. 5B has a longer time to start and stabilize the ion beam, and may be seconds or longer. The scheme of FIG. 5C has a longer time to start and stabilize the ion beam, and may be seconds or longer. However, the schemes of FIGS. 5A and 5B are operable to terminate the ion beam in less than 1 ms, while the scheme of FIG. 5C may require a little longer time to terminate the ion beam. The reasons for these response times are within the physics behind each of these schemes, and depend upon how the control parameters such as Ve and Vsup, Va, or Vc affect the ion beam or plasma, respectively.

Figure 6:
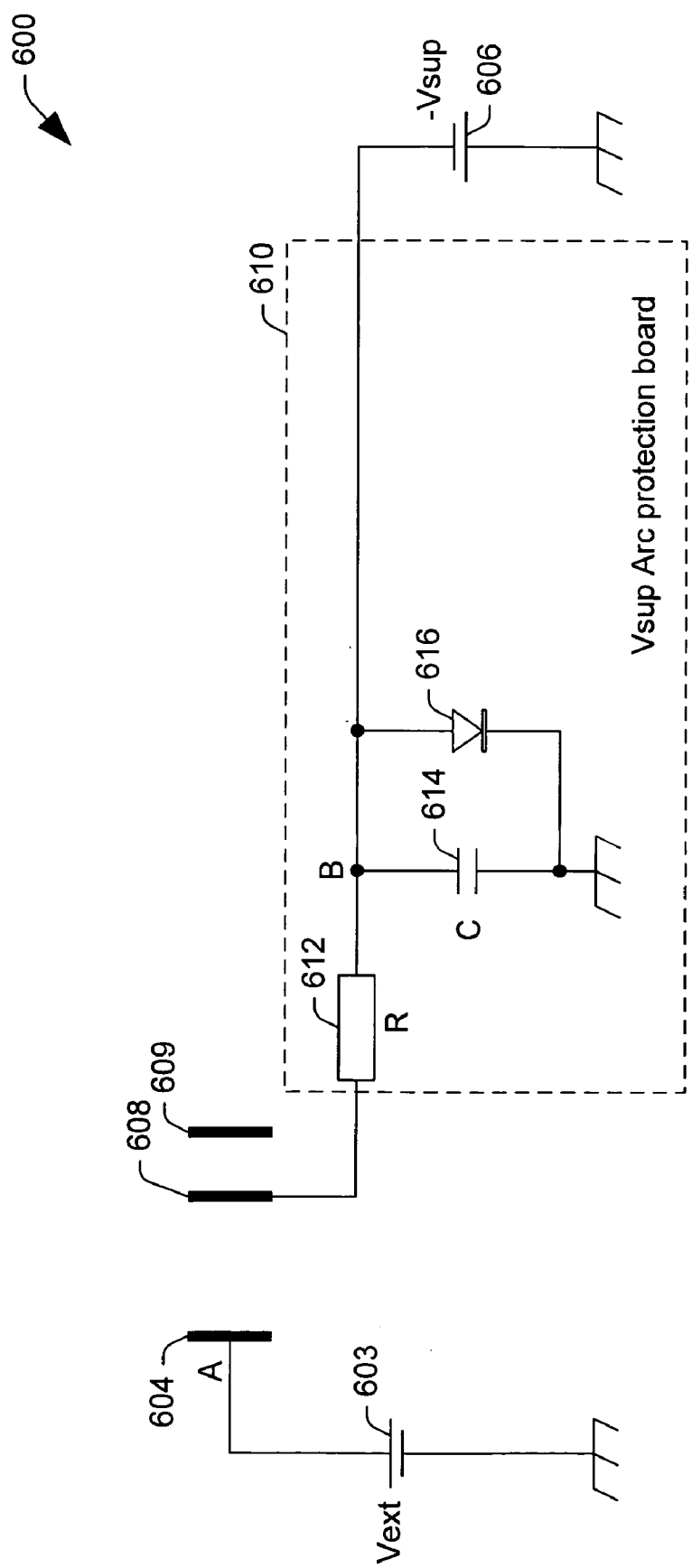
FIG. 6 is a simplified schematic diagram of an exemplary suppression electrode high voltage supply circuit having an arc suppression circuit such as may be used in the beam control circuit of the present invention.

FIG. 6 illustrates an exemplary suppression electrode high voltage supply circuit 600 having an arc suppression circuit 610 such as may be used in the beam control circuit of the present invention (e.g., protection circuit 515 of FIG. 5A).

The suppression electrode high voltage supply circuit 600 of FIG. 6 comprises a high positive voltage extraction supply 603 which feeds extraction slits 604, and a high negative voltage suppression supply 606 which feeds suppression electrodes 608 neighboring ground electrodes 609. The HV suppression supply 606 has a conventional arc suppression or protection circuit 610, which may use a current limiting resistor 612 to limit the arc current to the suppression electrodes 608, a capacitor 614 to filter and stabilize the voltage of the supply, and a fly-back diode 616 to limit any reverse voltages generated from reactive elements of the circuit during over-voltage ringing or arc on-off cycling. In the context of the present invention, the arc protection board 610 may also be used in association with the HVHS switch (e.g., 104 of FIG. 1) of the invention to protect the HVHS switch from damage.

Figure 7:
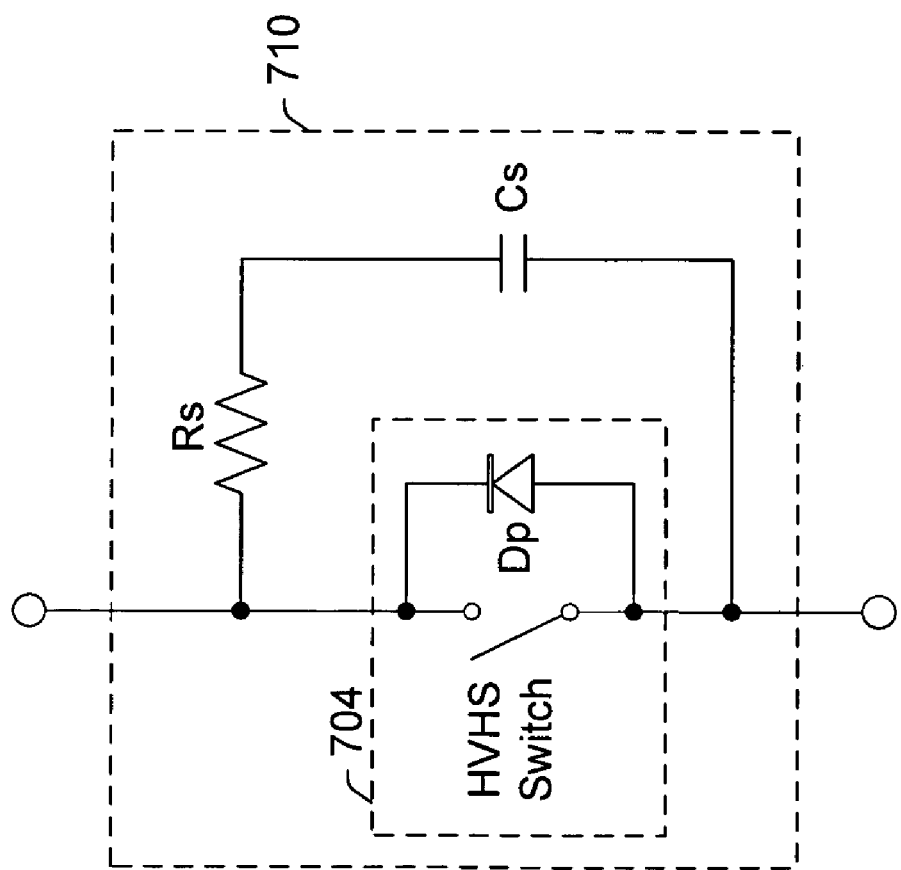
FIG. 7 is a schematic diagram of an exemplary protection circuit such as may be used across or in series with a HVHS switch to absorb energy from reactive elements external to the respective HV switch, and to limit an over-voltage across the switch in accordance with one or more aspects of the present invention.

FIG. 7 illustrates an exemplary protection circuit 710 such as may be used across or in series with a HVHS switch 704 to absorb energy from reactive elements external to the respective HV switch 704 (e.g., or switch 104 of FIG. 1), and to limit an over-voltage across the switch in accordance with one or more aspects of the present invention. The protection circuit 710 also protects the switch 704 and other associated components by dampening any ringing induced by switching transients from the HVHS switch 704. Protection circuit 710 is similar to the protection circuit 110 of FIG. 1 and 510 of FIG. 5A. Protection circuit 710 comprises a series capacitor Cs connected in series with a resistor Rs, the protection circuit 710 being wired in parallel with a HVHS switch 704. The HVHS switch 704 comprises a HVHS switch (e.g., a series stack of MOSFET transistors) and a diode Dp connected in parallel with the switch. The HVHS switch 704 may be provided, for example, with or without the parallel diode Dp.

Figure 8:
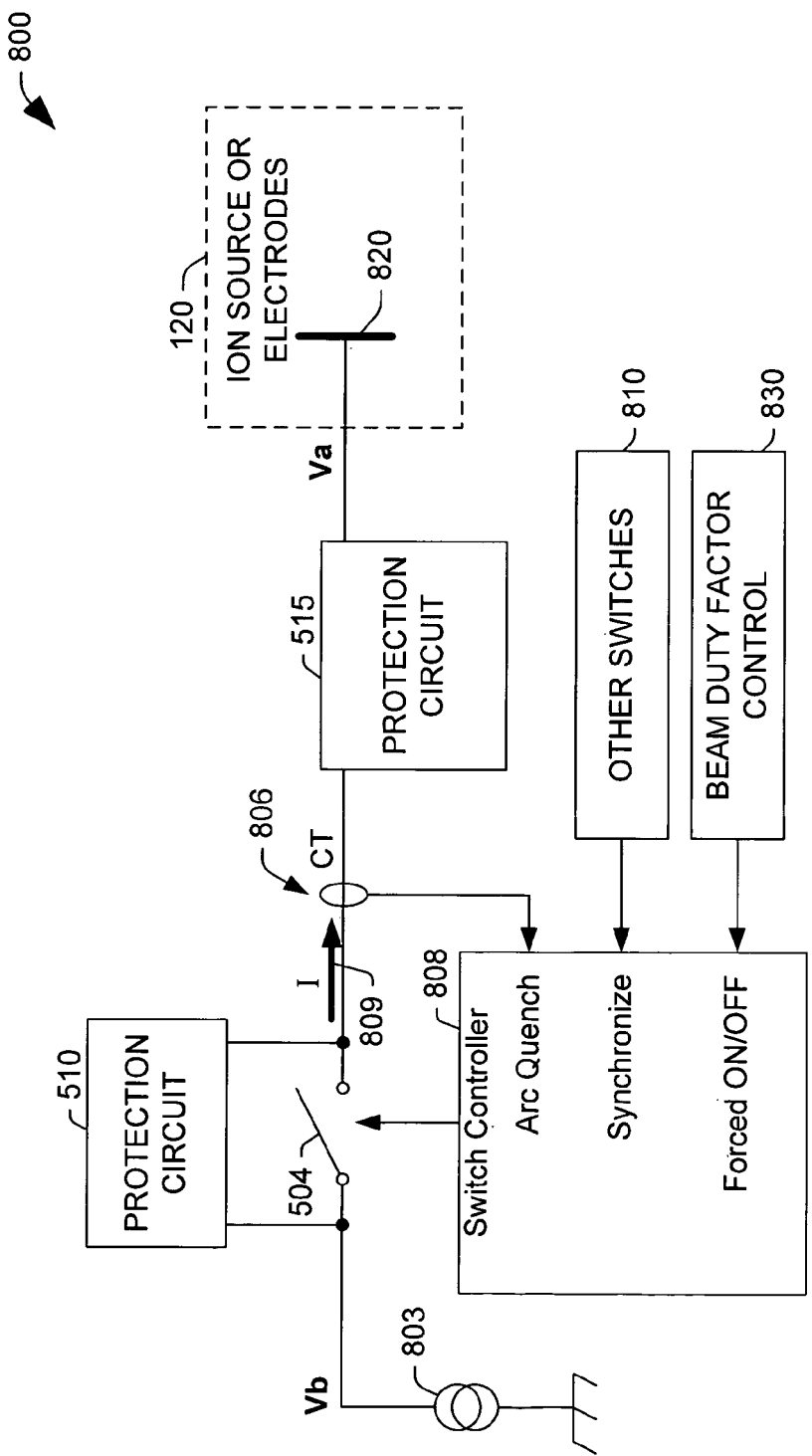
FIG. 8 is a simplified schematic diagram of an exemplary beam control circuit 800 used in an ion implanter, utilizing a HVHS switch between a voltage supply and an electrode of the implanter, and utilizing a switch controller to sequence, control, and synchronize the termination and initiation of the current and voltage to one or more electrodes based on a current or voltage detection, a synchronization signal from other switches or other switch controllers, duty factor control input commands, a motion control system, or forced switch control commands from the ion implantation system in accordance with one or more aspects of the present invention, and further illustrating that the same switch can serve both glitch quench as well as beam duty factor control applications.

It will be appreciated in the context of the present invention that two or more such HS switches may be connected in series or parallel with each other to open or close the connections between a voltage supply and an ion source of an ion implanter, or any other such equipment, for example. FIG. 8 illustrates an exemplary beam control circuit 800 having a switch controller 808 (or an ion beam controller), such as may be used in an ion implantation system (e.g., 200 of FIG. 2), utilizing a high voltage and/or high speed HVHS switch 504 between a voltage supply 803 and an electrode 820 (e.g., cathode 320) of an ion source 120 of the implanter 200. Beam control circuit 800 is similar to the beam control circuits of FIGS. 1, 5A, 5B, and 5C, and as such need not be completely described again for the sake of brevity. The beam control circuit 800 utilizes a switch controller 808 to sequence, control, and synchronize the reestablishment of a connection of the voltage to one or more electrodes from other switches 810, to coordinate beam duty factor control commands 830 or other such forced switch control commands from the associated ion implantation system in accordance with one or more aspects of the present invention. Beam control circuit 800 also illustrates that the same switch can serve applications of both glitch quench and the beam duty factor control.

Optionally, the other HVHS switches 810 may be from other electrode supplies of the same ion implanter, or they may be from other HVHS switches of other similar switch controllers 808, which are not shown. The various switches of these circuits may need to be synchronized to ensure the desired order and timing for opening and closing the switches 810.

Beam control circuit 800 may further comprise an arc quench detection circuit input to the switch controller 808, for example, from the detection of a current or voltage change corresponding to an arc at the electrode 820. The arc detection circuit may comprise a current transformer CT 506, for example, used to detect a change or glitch in the current I 809 to the ion source electrode 820. For example, when a longer glitch is detected, a repaint process may be initiated by the switch controller 808. During this repaint process, the HVHS switch control may be forced ON/OFF in response to a repaint command, or in response to the positions achieved by a motion control system (not shown), for example.

Thus, because the HVHS switches 504 are present in the circuit of the present invention, the implanter system is provided with the ability to simply turn the ion beam 130 ON or OFF at will, either manually with a switch or by way of command 830 from one of the implanters control systems, its computer, or by an external input, thereby providing the operability to minimize the duty factor of the ion beam and minimize particle contamination.

In addition, it may be particularly beneficial to be able to turn the beam 130 ON/OFF, for example, when loading or unloading a new wafer (e.g., 242 of FIG. 2), during other types of wafer exchange, at the start/end of each wafer scan, or in the over-travel regions of each row scan of a wafer 242 for further enhancing beam duty factor reduction. This is to say that by disabling the beam via the HVHS switches, the total time required of the ion beam in the beam line and the wafer process chamber is reduced. Accordingly, the beam control circuit 800 of the present invention facilitates reducing the "beam duty factor" and should therefore reduce the particle count on a wafer 242 because the beam will be used to a greater percentage usefully on the wafer 242 and less on the other surfaces of the implanter adjacent to the wafer 242 (e.g., in the over-travel regions of a wafer).

It will be further appreciated that the HVHS switches of the present invention can be switched at one or more particular frequencies to modulate or otherwise provide dynamic pulse width control of the several electrode voltages, and/or the beam current in response to a desired beam duty factor control input or the detection of an arc. In addition to the beam duty factor control and quenching of electrode arcs, the power supply modulation may also be provided in response to some known non-uniformity in the system (e.g., where a particular beam current results in a predictable non-uniformity). It may also be appreciated that while one use of such modulation is to achieve a uniform dosage on a wafer, it could be used to achieve any predetermined dopant profile, where uniformity is a subset of the general case.

Although the beam control circuits and switch controller of the invention has been illustrated in association with a HV power supply for an ion source and an extraction electrode, and a power supply for an ion source and an arc voltage or cathode electrode, it will be appreciated that such circuits may also be used in association with the other power supplies of higher and lower voltages and electrodes of an ion implanter, or other such ion sources and accelerators, including other applications requiring an ion beam, electron beam, or plasma control, and as such are anticipated in the context of the present invention.

Again, it will also be appreciated that the high voltage and/or high speed switches discussed herein may not need to be high voltage rated or high speed rated switches when used for switching the lower cathode or arc voltages discussed above depending on the desired response times of the system application under consideration.

One aspect of the present invention provides a method of controlling an ion beam, which is presented and described herein. One implementation of the present invention receives an ion beam ON or OFF command to effectively initiate the ion beam before the start of ion implantation by closing a high-voltage switch in response to the ion beam ON command. The ions are then implanted within a target wafer, for example. The ion beam is then terminated after the conclusion of the ion implantation by opening a high-voltage switch in response to the ion beam OFF command, thereby minimizing the ion beam duty factor and particle contamination within the ion implantation system. For example, the high voltage high speed switch described herein may be wired in series between the electrode and a voltage supply which provides the electrode potential to control the ion beam or the plasma which supplies the ion beam.

Thus, only the time intervals prior to and after the ion implantation may reduce the beam duty factor, however, these intervals may be very short compared to that of the ion implantation time. In this way the ion beam duty factor may be improved and the particle contamination potential may be reduced significantly.

Figure 9:
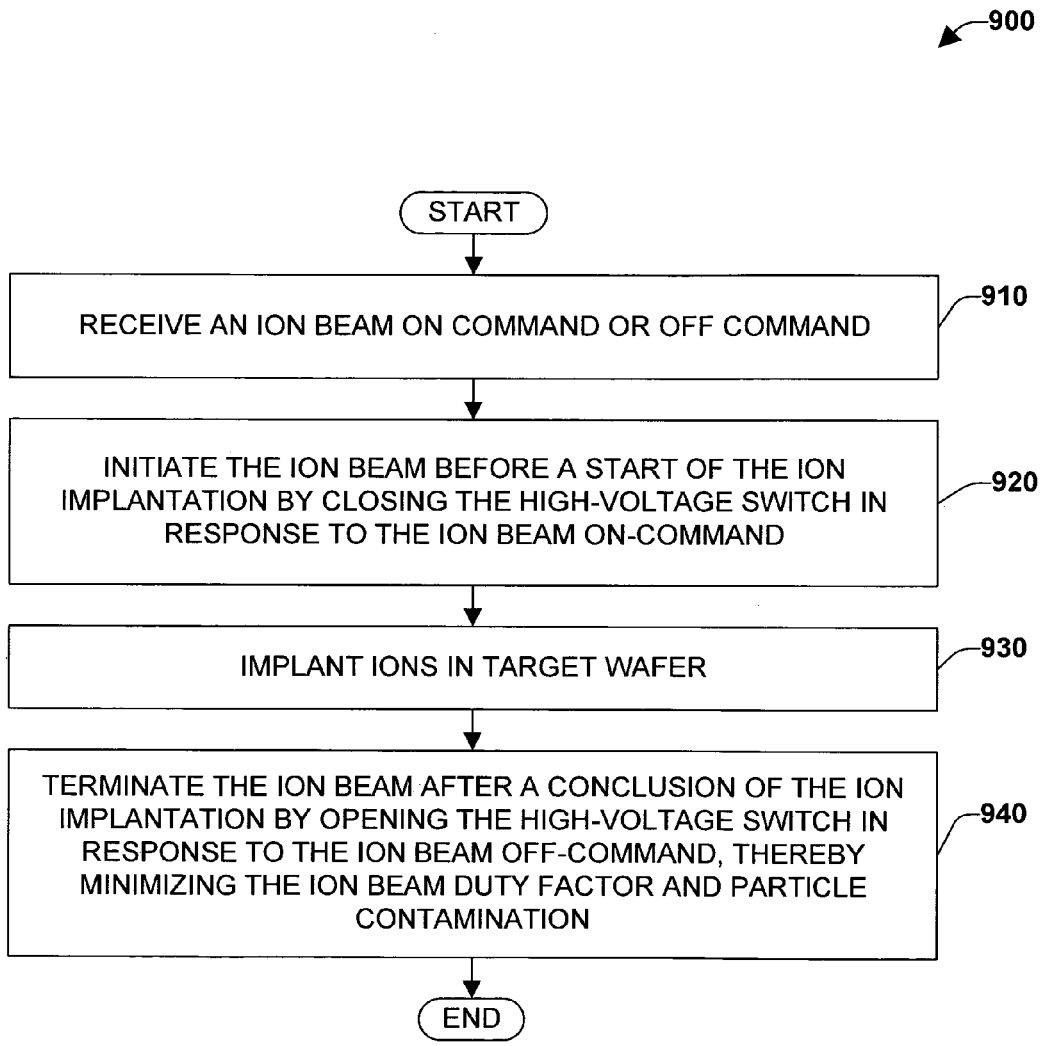
FIG. 9 is a flow diagram of an exemplary method for ion beam control in an ion implanter, for example, using a beam control circuit of FIG. 1 of the present invention in accordance with one or more aspects of the present invention.

One such method 900 is illustrated in FIG. 9, representing an exemplary method for reducing the duty factor of an ion beam of an ion implanter, using a beam control circuit (e.g., 100 of FIG. 1, 500 of FIG. 5A, and 800 of FIG. 8) of the present invention in accordance with several aspects of the present invention. Although the example method 900 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafer or another such target, the ion beam or the plasma for producing the ion beam, the beam control circuit or the high voltage switches used to switch the voltage supplies to the various electrodes, and the ion source or the ion implantation system illustrated and described herein as well as in association with other apparatus and structures not illustrated.

Method 900 comprises an exemplary beam control method 900 that may be used to minimize particle contamination in an ion implantation system (e.g., 200 of FIG. 2) utilizing a beam control circuit (e.g., 100 of FIG. 1) comprising a switch controller (e.g., 108 of FIG. 1) and a high-voltage switch (e.g., 104 of FIG. 1) connected between a voltage supply (e.g., 102 of FIG. 1) and an ion source (e.g., 120 of FIG. 1) of the ion implantation system (e.g., 100 of FIG. 1). For example, optionally, a wafer 242 may be in the process of being implanted by an ion beam 130 (either by the wafer or the ion beam moving). At 910, the switch controller 108 of the beam control circuit 100 receives an ion beam ON or OFF command 108*a*, or a sync input 108*b* command from other such switch control circuits similar to switch controller 108. For example, the ion-beam ON switch command generally corresponds to time t1 of FIG. 4A prior to implantation.

At 920, the ion beam 130 is then initiated at time t1 for a first time interval (e.g., 431 of FIG. 4A) before a start of ion implantation (e.g., 435 of FIG. 4A) at time t3 by closing the high-voltage switch (e.g., 104 of FIG. 1) in response to the ion beam ON command (e.g., 108*a* of FIG. 1) or to the sync input command (e.g., 108*b* of FIG. 1) when this command corresponds to an ON command. The first time interval (e.g., 431 of FIG. 4A), for example, allows adequate time for the ion beam 130 to stabilize before the start of ion implantation. For example, if the extraction (e.g., $V_E$ 352 of FIG. 3B) voltage or the suppression (e.g., $V_S$ 360 of FIG. 3B) voltage is switched, 1 ms may provide adequate time, however, if the arc voltage (e.g., $V_A$ 354 of FIG. 3B) or the cathode voltage (e.g., $V_C$ 356 of FIG. 3B) is switched, a few seconds may be needed for the plasma (e.g., 350 of FIG. 3B) and ion beam (e.g., 130 of FIG. 3B) to stabilize.

At 930, ions from ion beam (e.g., 130 of FIG. 1) are implanted within a target wafer (e.g., 242 of FIG. 2), for example, or another such target.

Finally, at 940, the ion beam is terminated at time t2 after a conclusion of the ion implantation 435 at time t4 by opening the high-voltage switch 104 in response to the ion beam 130 OFF command (e.g., 108*a* of FIG. 1) or to the sync input command (e.g., 108*b* of FIG. 1) when this command corresponds to an OFF command. The second time interval 432 between time t4 and time t2 may be relatively short, for example, about 1 ms or less whether the extraction, suppression, arc, or cathode voltage is switched off by the HVHS switch (e.g., 104 of FIG. 1), as the plasma (e.g., 350 of FIG. 3B) and the ion beam (e.g., 130 of FIG. 3B) disappear nearly instantaneously.

Thereafter, the method 900 of controlling an ion beam ends, wherein further ON/OFF commands may be subsequently applied to the beam control circuit of the present invention, wherein the duty factor of the ion beam may be minimized and particle contamination may be dramatically reduced by switching one or more of the supply voltages to the ion source of an ion implantation system.

It will be appreciated by those skilled in the art that the HVHS switches are basically applied to the extraction, suppression, arc, or cathode systems of any ion sources. It will also be appreciated that the aspects described herein are equally applicable to other ion sources including those that provide primary electron beam current in "soft ionization" ion sources, RF or microwave power in RF or microwave ion sources, as well as to non-arc discharge sources.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A beam control circuit for an ion implantation system comprising:
 a high voltage switch connected in series with a power supply and an electrode associated with an ion source portion of the ion implantation system, operable to interrupt or reestablish a connection between the power supply and the electrode; and
 a switch controller operable to control the duty factor of a beam produced within the ion implantation system by controlling the high voltage switch to close before ion implantation, to remain closed during ion implantation, and to open after ion implantation, thereby minimizing particle contamination.

2. The system of claim 1, further comprising one or more protection circuits associated with the high voltage switch, operable to absorb energy from reactive elements external to the high voltage switch, and to limit an over-voltage across the switch.

3. The system of claim 2, wherein the power supply and the electrode associated with the ion source portion of the ion implantation system comprises one or more of a suppression voltage power supply and an extraction voltage power supply and electrode associated with the ion source.

4. The system of claim 2, wherein one of the protection circuits is connected in series with the HV switch it protects.

5. The system of claim 2, wherein one of the protection circuits is connected in parallel with the HV switch it protects.

6. The system of claim 1, further comprising a synchronization circuit operable to synchronize and time two or more switch controllers of two or more beam control circuits for the opening and closing of two or more high voltage switches for the ion implantation system.

7. The system of claim 1, wherein the power supply and the electrode associated with the ion source portion of the ion implantation system comprises a cathode voltage power supply and electrode associated with the ion source.

8. The system of claim 1, wherein the power supply and the electrode associated with the ion source portion of the ion implantation system comprises an arc voltage power supply and electrode associated with the ion source.

9. The system of claim 1, wherein the duty factor of the beam comprises a ratio of a predetermined on-time to the predetermined on-time plus an off-time, wherein the predetermined on-time generally corresponds to the ion implantation time and an ion beam settling time, and the predetermined off-time generally corresponds to an idle time of the beam after ion implantation.

10. The system of claim 1, wherein the switch controller is further operable to control the high-voltage switch to close for a first time interval before a start of the ion implantation and to remain closed for a second time interval after a conclusion of the ion implantation.

11. The system of claim 10, wherein one of the first and second time intervals is between about one millisecond and about two minutes.

12. The system of claim 10, wherein one of the first and second time intervals is about one millisecond or less.

13. The system of claim 1, wherein the switch controller is operable to detect a current or voltage change associated with the electrode and to control one or more high voltage switches to open or close based on the detection to quench an arc associated with the ion source.

14. The system of claim 1, wherein the switch controller is further operable to terminate the ion beam during one of, arrival at a wafer load or unload position, a manual beam OFF switch operation, an arc detection, and a wafer exchange, and to initiate the ion beam during one of, a manual beam ON switch operation, subsequent to a wafer exchange, following a load operation, and upon a command to implant another wafer.

15. The system of claim 1, wherein the switch controller is further operable to receive a beam duty factor command from the ion implantation system or a motion control system to disable the high voltage switch during one of, arrival at a wafer exchange position, receipt of a manual beam OFF switch command, waiting for a next wafer or an implant auto recovery, and prior to a wafer exchange.

16. The system of claim 1, wherein the switch controller is commanded by an external control input.

17. The system of claim 1, further comprising:
a trigger control circuit operable to detect a current or voltage change associated with the electrode and to control one or more high voltage switches to open or close based on the detection; and
one or more protection circuits, each protection circuit associated with one of the high voltage switches, operable to absorb energy from reactive elements external to the respective high-voltage switch, and to limit an over-voltage across the switch.

18. A beam control circuit for minimizing particle contamination in an ion implantation system comprising:
an ion source for producing a quantity of ions which can be extracted in the form of an ion beam;
a high voltage switch connected in series between a power supply and an electrode associated with the ion source portion of the ion implantation system, operable to interrupt or reestablish a connection between the power supply and the electrode; and
a switch controller operable to initiate the ion beam before ion implantation by closing the high voltage switch, to maintain the ion beam during implantation by having the high voltage switch remain closed, and to terminate the ion beam after ion implantation by opening the high voltage switch, thereby minimizing particle contamination.

19. The system of claim 18, further comprising one or more protection circuits associated with the high voltage switch, operable to absorb energy from reactive elements external to the high voltage switch, and to limit an over-voltage across the switch.

20. The system of claim 19, wherein the power supply and the electrode associated with the ion source portion of the ion implantation system comprises one or more of a suppression voltage power supply and an extraction voltage power supply and electrode associated with the ion source.

21. The system of claim 19, wherein one of the protection circuits is connected in series with the HV switch it protects.

22. The system of claim 19, wherein one of the protection circuits is connected in parallel with the HV switch it protects.

23. The system of claim 18, further comprising a synchronization circuit operable to synchronize and time two or more switch controllers of two or more beam control circuits for the opening and closing of two or more high voltage switches for the ion implantation system.

24. The system of claim 18, wherein the power supply and the electrode associated with the ion source portion of the ion implantation system comprises one or more of a cathode voltage power supply and electrode associated with the ion source.

25. The system of claim 18, wherein the power supply and the electrode associated with the ion source portion of the ion implantation system comprises an arc voltage power supply and electrode associated with the ion source.

26. The system of claim 18, wherein the duty factor of the beam comprises a ratio of a predetermined on-time to the predetermined on-time plus an off-time, wherein the predetermined on-time generally corresponds to the ion implantation time and an ion beam settling time, and the predetermined off-time generally corresponds to an idle time of the beam after ion implantation.

27. The system of claim 18, wherein the switch controller is further operable to control the high-voltage switch to close for a first time interval before a start of the ion implantation and to remain closed for a second time interval after a conclusion of the ion implantation.

28. The system of claim 27, wherein one of the first and second time intervals is between about one millisecond and about two minutes.

29. The system of claim 27, wherein one of the first and second time intervals is about one millisecond or less.

30. The system of claim 19, wherein the switch controller is further operable to terminate the ion beam during one of, arrival at a wafer load or unload position, a manual beam OFF switch operation, an arc detection, and a wafer exchange, and to initiate the ion beam during one of, a manual beam ON switch operation, subsequent to a wafer exchange, following a load operation, and upon a command to implant another wafer.

31. The system of claim 19, wherein the switch controller is further operable to receive a beam duty factor command from the ion implantation system or a motion control system to disable the high voltage switch during one of, arrival at a wafer exchange position, receipt of a manual beam OFF switch command, waiting for a next wafer or an implant auto recovery, and prior to a wafer exchange.

32. The system of claim 19, further comprising:
a trigger control circuit operable to detect a current or voltage change associated with the electrode and to control one or more high voltage switches to open or close based on the detection; and
one or more protection circuits, each protection circuit associated with one of the high voltage switches, operable to absorb energy from reactive elements external to the respective high-voltage switch, and to limit an over-voltage across the switch.

33. A method of reducing the duty factor of an ion beam to minimize particle contamination in an ion implantation system utilizing a beam control circuit comprising a switch controller and a high-voltage switch connected between a voltage supply and an electrode associated with an ion source of the ion implantation system, the method comprising:
receiving one of a beam ON command or a beam OFF command;
initiating the ion beam before a start of ion implantation by closing the high-voltage switch connected between the voltage supply and the electrode associated with the ion source, in response to the beam ON command;
implanting ions; and
terminating the ion beam after a conclusion of ion implantation by opening the high voltage switch in response to the beam OFF command, thereby minimizing the duty factor of the beam and reducing particle contamination.

34. The method of claim 33, further comprising synchronizing two or more switch controllers having two or more high voltage switches used to initiate or terminate the ion beam of the ion implanter.

35. The method of claim 33, wherein the switch controller is further operable to control the high-voltage switch to close for a first time interval before the start of ion implantation and to remain closed for a second time interval after the conclusion of ion implantation.

36. The method of claim 33, wherein the ion beam is forced on or off by the high-voltage switch.

37. The method of claim 33, wherein the beam control circuit is further operable to control the high-voltage switch to open for a predetermined time period following the detection of an arc.

38. The method of claim 33, wherein the switch controller is further operable to terminate the ion beam during one of, arrival at a wafer load or unload position, a manual beam OFF switch operation, an arc detection, and a wafer exchange, and to initiate the ion beam during one of, a manual beam ON switch operation, subsequent to a wafer exchange, following a load operation, and upon a command to implant another wafer.

* * * * *